US008005240B2

(12) United States Patent
Linse et al.

(10) Patent No.: US 8,005,240 B2
(45) Date of Patent: Aug. 23, 2011

(54) SPEAKER WITH FREQUENCY DIRECTED DUAL DRIVERS

(75) Inventors: Jason N. Linse, Portland, OR (US); Jeffery S. Anderson, Camas, WA (US)

(73) Assignee: Logitech Europe S.A., Morges (CH)

( * ) Notice: Subject to any disclaimer, the term of this patent is extended or adjusted under 35 U.S.C. 154(b) by 1211 days.

(21) Appl. No.: 11/135,753

(22) Filed: May 23, 2005

(65) Prior Publication Data

US 2006/0093160 A1 May 4, 2006

Related U.S. Application Data

(60) Provisional application No. 60/573,050, filed on May 21, 2004.

(51) Int. Cl.
*H03G 5/00* (2006.01)
*H04R 29/00* (2006.01)

(52) U.S. Cl. ........................................... 381/99; 381/59

(58) Field of Classification Search .................... 381/99, 381/98, 333, 306, 388, 355; 333/132, 133
See application file for complete search history.

(56) References Cited

U.S. PATENT DOCUMENTS 3,984,635 A * 10/1976 Nestorovic et al. ............ 381/89
4,233,472 A 11/1980 Kleis
4,897,879 A 1/1990 Geluk
4,991,221 A * 2/1991 Rush ............................ 381/120
5,297,212 A 3/1994 Murayama et al.
5,598,480 A 1/1997 Kim
5,781,642 A 7/1998 Tanaka et al.
6,259,799 B1 * 7/2001 Suzuki et al. ................. 381/401
6,381,334 B1 * 4/2002 Alexander ...................... 381/99
2005/0226441 A1 10/2005 Tanaka et al.

FOREIGN PATENT DOCUMENTS

DE 2431554 A1 1/1976
DE 10054033 C1 5/2002
JP 03117200 A 5/2001
WO WO 2004/068897 A1 8/2004
WO WO 99/27433 A1 6/2009

OTHER PUBLICATIONS

International Preliminary Report on Patentability; PCT app. No. PCT/US2005/018140; Nov. 21, 2006; 4 pages.
Notification Concerning Transmittal of International Preliminary Report on Patentability; PCT app. No. PCT/US2005/018140; Nov. 30, 2006; 1 page.
Search/Examination Report dated Dec. 28, 2009 from European Application No. 05754103.9, 3 pages.

(Continued)

*Primary Examiner* — Xu Mei
(74) *Attorney, Agent, or Firm* — Kilpatrick Townsend & Stockton LLP

(57) ABSTRACT

A speaker that includes a pair of spaced-apart, in-plane mounted drivers connected in series to a network for applying the appropriate frequency component of the electrical input drive signal to each of the drivers is disclosed. A frequency dependent shunting network, such as a low pass filter, is applied to one of the drivers so as to gradually mute the one driver as a desired frequency is approached. The result is an aesthetically pleasing speaker that has dual in-plane drivers and that produces superior sound quality throughout the entire frequency range of the speaker, including those ranges in which dual, in plane, drivers tend to acoustically interfere with each other.

15 Claims, 4 Drawing Sheets

OTHER PUBLICATIONS

International Search Report; PCT app. No. PCT/US05/18140; Jun. 30, 2006; 3 pages.
Written Opinion of the International Searching Authority; PCT app. No. PCT/US05/18140; Jun. 30, 2006; 3 pages.
Notification of Transmittal of International Search Report and Written Opinion; PCT app. No. PCT/US05/18140; Jun. 30, 2006; 1 page.

* cited by examiner

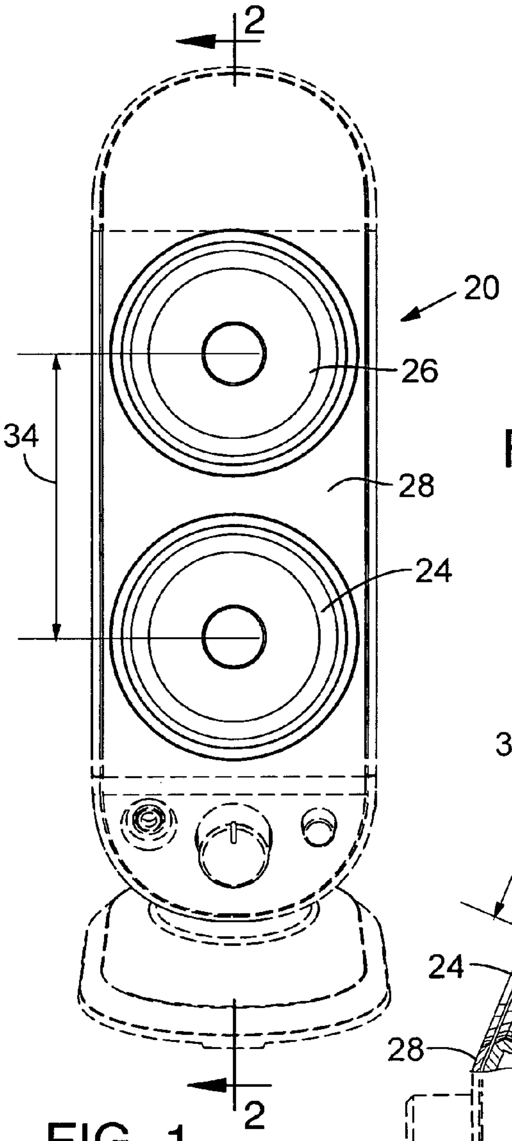
FIG. 1
FIG. 2
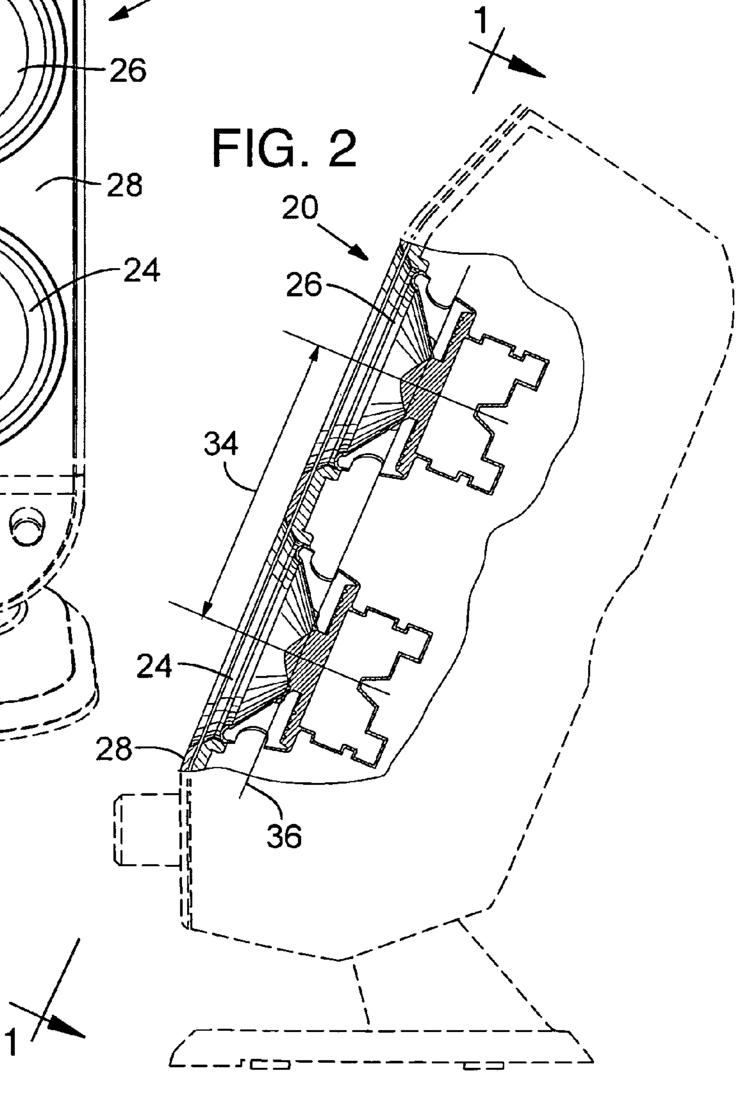

SPEAKER WITH FREQUENCY DIRECTED DUAL DRIVERS

CROSS-REFERENCE TO RELATED APPLICATION

This application claims priority to U.S. provisional patent application Ser. No. 60/573,050, filed on May 21, 2004.

FIELD OF THE INVENTION

The present invention relates to a control system for independently modulating the activation of broad frequency, dual, in-plane drivers in a speaker based on the commanded frequency to be output by the drivers.

BACKGROUND OF THE INVENTION

A typical broadband loudspeaker system usually includes separate loudspeakers for providing the different frequency components of the broadband acoustic signal. These separate loudspeakers are coupled together by a suitable crossover network for applying the appropriate frequency component of the electrical input drive signal to each of the loudspeakers.

Usually, these types of speaker systems have more than one driver (i.e. a midrange and tweeter) that operate within at least a portion of the same frequency range. When two of these drivers operate within that range, destructive interference, which is also often referred to as phase discontinuity, in the axial response can arise caused by the cancellation of the spaced-apart like sound waves generated by each component.

Because of the finite distance between the two drivers, the sound waves will have a phase discontinuity. At points in space located axially about the speaker system, the two sound waves will sum or subtract from each other causing the net audio signal at that frequency to be muted or accentuated. This is commonly referred to as lobing and is shown schematically in prior art FIG. 5B.

More recently, speakers having dual, spaced-apart, in plane, drivers that operate within the same frequency range are gaining in popularity, particularly for use as auxiliary computer speakers. However, one side effect of having dual, spaced-apart, in-plane drivers is that they will acoustically interfere with each other over a much broader frequency range when operated together.

Efforts to reduce or prevent this interference have had limited success. For example, U.S. Pat. No. 4,233,472 to Kleis, the disclosure of which is hereby incorporated by reference, disclosures connecting more than two in-plane drivers together in series with some of the drivers being mutable at defined frequencies as a result of low pass filtering. While such structures reduce some interference, it relies on more than two drivers with at least two of the drivers being positioned at an angle with respect to each other. Such a configuration is not desirable in many speaker applications, including use as auxiliary computer speakers, which favor having only two, spaced apart, in-plane drivers in each speaker.

SUMMARY OF THE INVENTION

Accordingly, despite the available improvements offered by available interference control systems, there remains a need for a cost effective control system that modulates the activation of broad frequency drivers of a speaker having dual, in-plane, drivers based on the commanded frequency to be output by those drivers.

The present invention is a speaker that includes a pair of spaced-apart, in-plane mounted drivers connected in series to a network for applying the appropriate frequency component of the electrical input drive signal to each of the drivers. A frequency dependent shunting network is applied to one of the drivers so as to gradually mute the one driver as a desired frequency is approached. The frequency dependent shunting network also serves to gradually increase the power provided to the other driver. Accordingly, this power increase is proportional to the amount of muting on the other driver, thereby preventing the muting of the first driver and related power increase on the second driver from being discernable to a listener.

The result is an aesthetically pleasing speaker that has dual in-plane drivers and that produces superior sound quality throughout the entire frequency range of the speaker, including those ranges in which dual, in-plane, drivers tend to interfere with each other.

BRIEF DESCRIPTION OF THE DRAWINGS

FIG. 1 is a front view of a speaker having dual, spaced-apart, in-plane drivers in accordance with an embodiment of the present invention.

FIG. 2 is a cross-sectional view of the speaker of FIG. 1 taken along line 2-2 of FIG. 1.

DETAILED DESCRIPTION OF PREFERRED EMBODIMENTS

Figure 3:
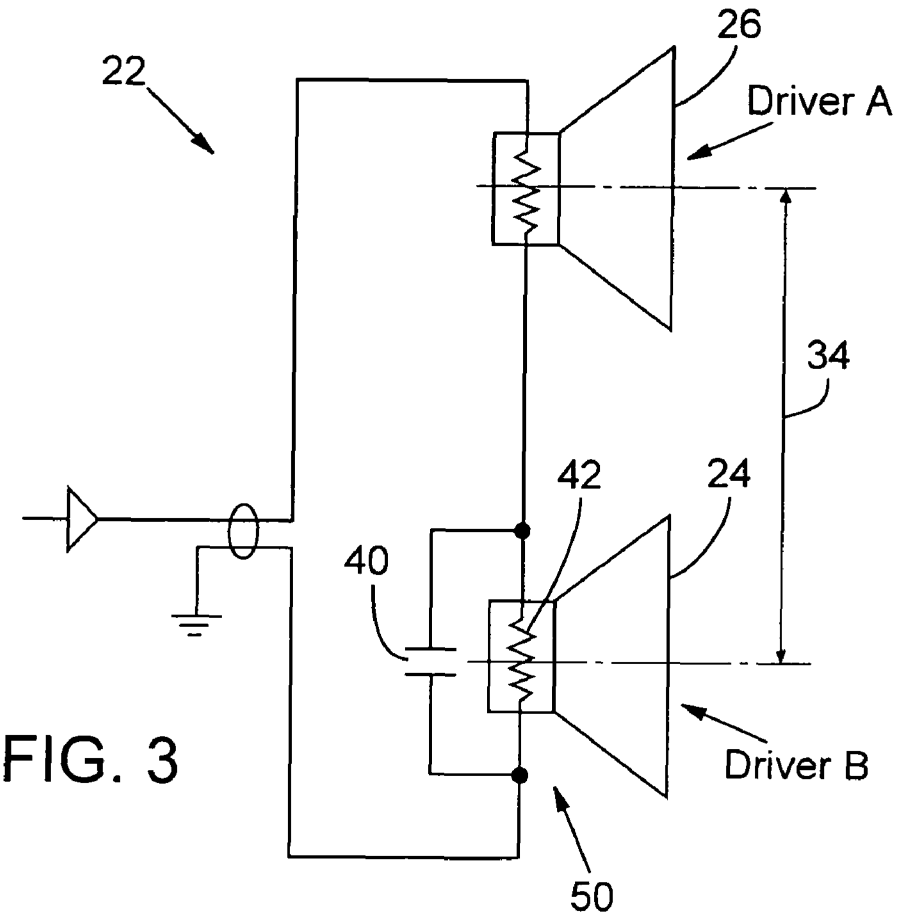
FIG. 3 is a schematic diagram of a preferred control system for modulating the activation of the drivers of FIG. 1 based on the commanded frequency of the drivers.

A dual-driver speaker 20 having a driver activation control system 22 for modulating the activation of the drivers 24, 26 based on their commanded frequency is disclosed in FIGS. 1-4, with comparison information showing exemplar benefits of the present invention over the prior art shown in FIGS. 5A-7.

The speaker 20 preferably includes a case 28 operably securing a first driver 24 and a second driver 26, to define a pair of drivers, therein. Each driver of the pair of drivers is preferably spaced apart from the other driver by a defined distance 34 and positioned so as to be substantially in the same plane 36 with each other as best shown in FIG. 2. The speaker 20 includes conventional electronics and related circuitry to receive an electrical input drive signal and apply an appropriate frequency component of the electrical input drive signal to each of the drivers. Preferably, the drivers 24, 26 are substantially identical and configured to operate within substantially the same range of frequencies.

An exemplar driver activation control system 22 for modulating the activation of the drivers 24, 26 based on their commanded frequencies is shown in FIG. 3. Both of the drivers 24, 26 are preferably connected together in series as shown. A capacitor 40 with a defined capacitance is connected across one of the drivers (here driver 24 is shown) so that the defined capacitance of the capacitor 40 and resistance 42 of the driver 24 thereby operate as a low pass filter 50.

Figure 4:
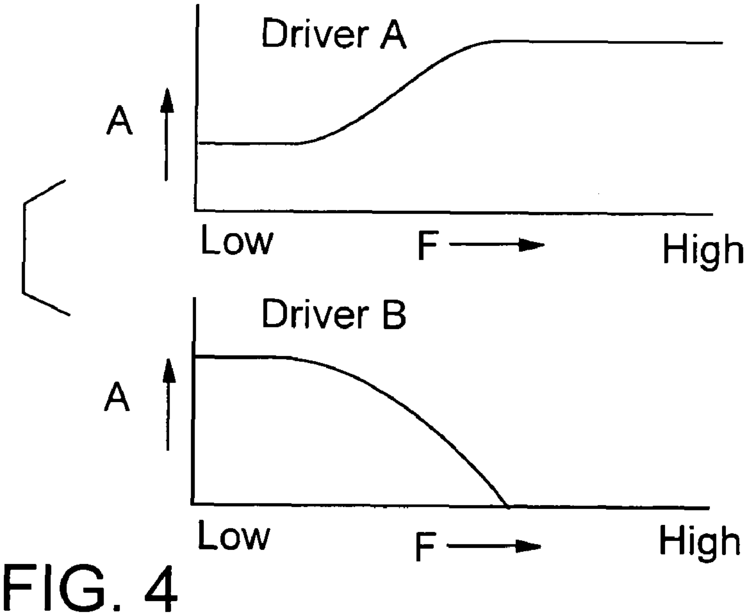
FIG. 4 details a preferred activation response for each driver of the drivers of FIG. 1 based on an increased commanded frequency of the drivers.
Figure 5A:
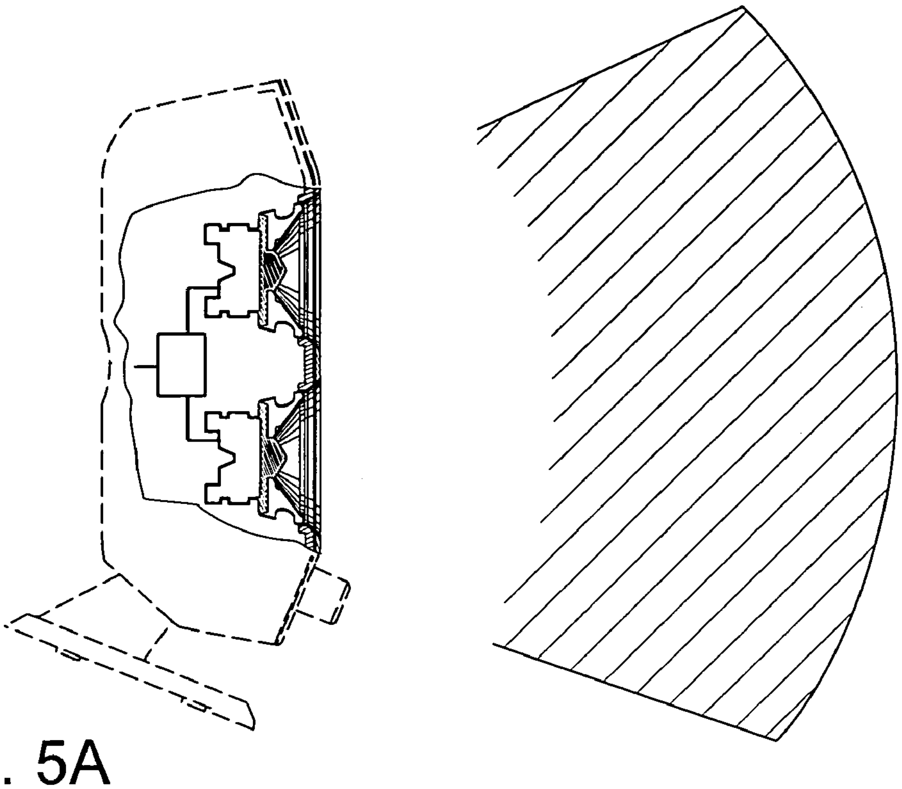
FIG. 5A is a schematic diagram displaying the acoustic benefits of the present invention on a dual, spaced-apart, in-plan driver speaker.
Figure 5B:
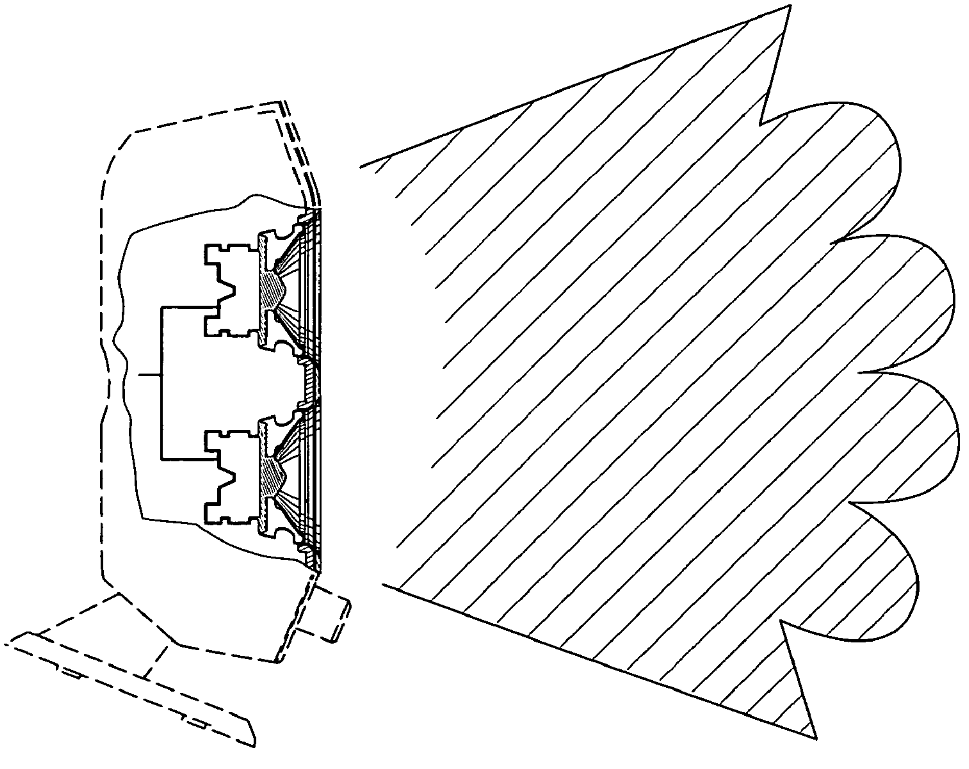
FIG. 5B Prior Art
FIG. 5B (PRIOR ART) is a schematic diagram displaying the acoustic characteristic of a dual, spaced-apart, in-plane driver speaker of FIG. 5A without the present invention activated thereon.
Figure 6:
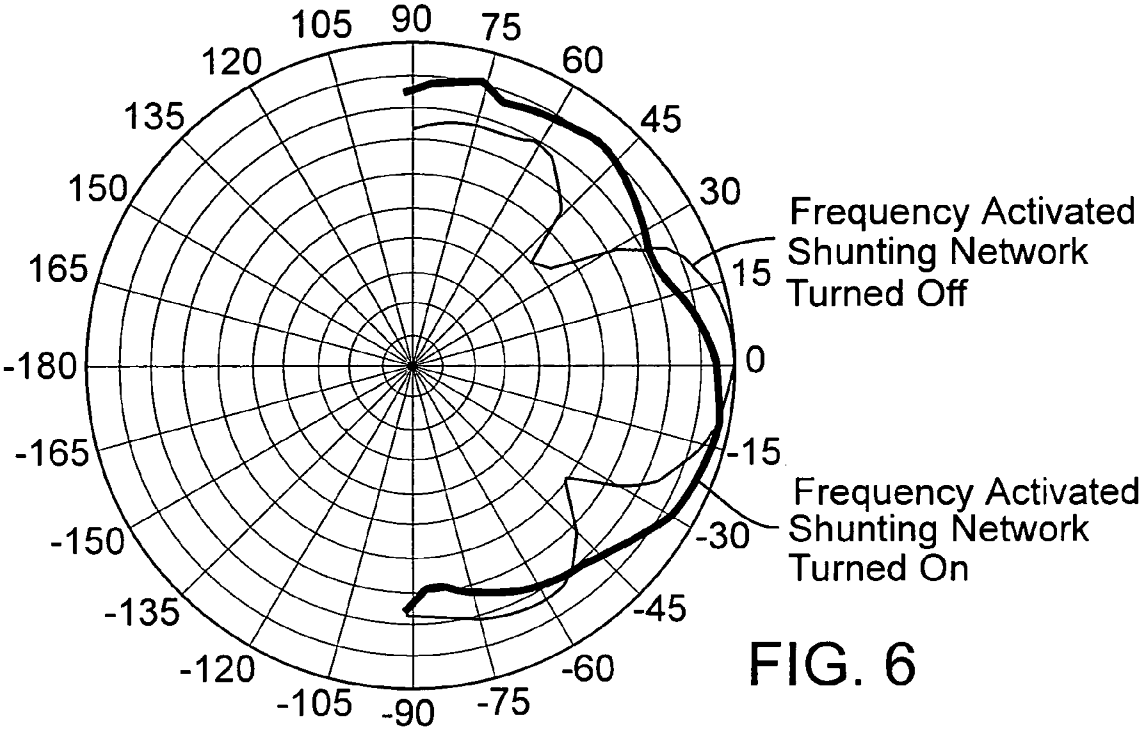
FIGS. 6 & 7 are schematic polar maps comparing the same dual-driver, in-plane, speaker performance at two different frequencies (approximately 4000 Hz for FIG. 6 and approximately 8000 Hz for FIG. 7) with the present invention activated and again without it activated.
Figure 7:
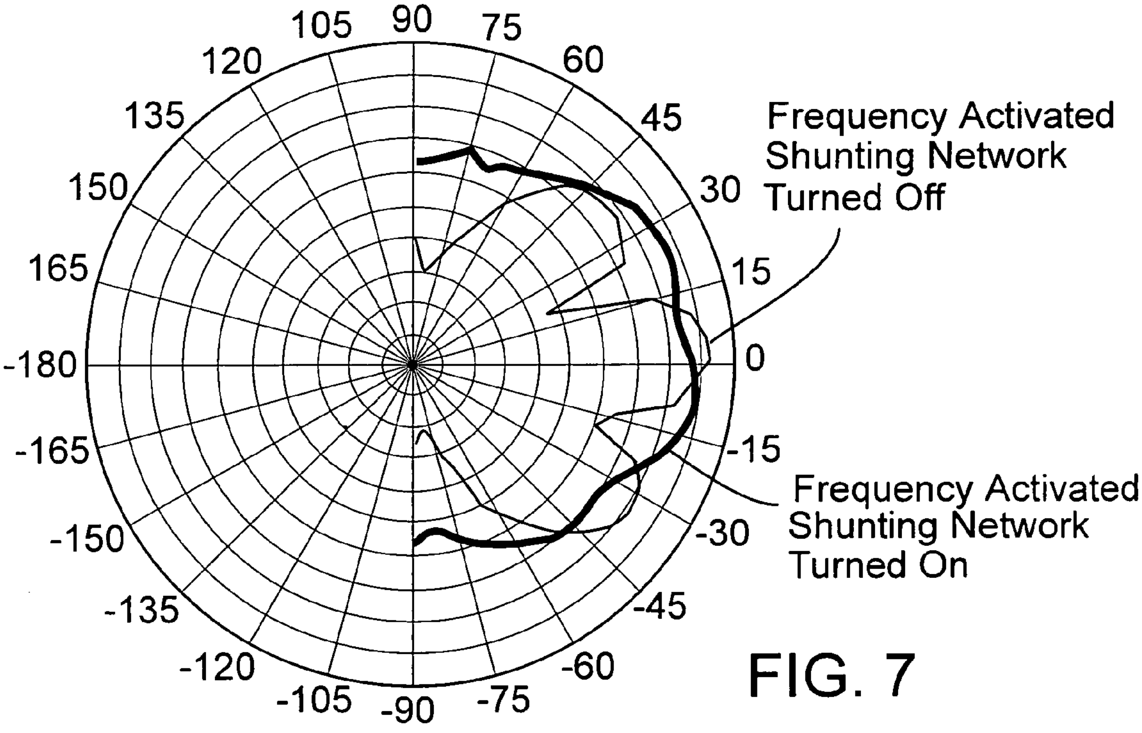

Preferably and as shown in FIG. 4, the defined capacitance is selected so as to allow the driver 24 to gradually mute as a defined frequency is achieved. The low pass filter 50 also serves to gradually increase the amplitude of the second driver 26. This amplitude increase is proportional to the amount of muting on the first driver 24, thereby preventing the activation of the low pass filter 50 from being discernable to a listener.

The desired frequency cut-off for the low pass filter 50 is a function of the speaker components and the distance the drivers are spaced apart from each other. For example, in cases where the speaker is to be used as a computer speaker, and the drivers are spaced apart from each other by about 2.5 inches. Particular success at reducing interference was achieved by selecting a capacitance of the capacitor so that the cutout frequency was about 5600 Hz or above.

The result is an aesthetically pleasing, dual-driver speaker 20 that has superior sound quality through the entire frequency range of the speaker 20, including those ranges in which dual, in-plane, drivers tend to interfere with each other.

Having described and illustrated the principles of our invention with reference to a preferred embodiment thereof, it will be apparent that the invention can be modified in arrangement and detail without departing from such principles. In view of the many possible embodiments to which the principles may be put, it should be recognized that the detailed embodiment is illustrative only and should not be taken as limiting the scope of our invention. Accordingly, we claim as our invention all such modifications as may come within the scope and spirit of the following claims and equivalents thereto.

The invention claimed is:

1. A speaker operably secured to a network for applying an appropriate frequency component of an electrical input drive signal, said speaker comprising:
- a frame;
- a pair of drivers operably secured to said frame and spaced apart from each other by a defined distance;
- said pair of drivers mounted substantially in the same plane and connected in series to the network;
- said pair of drivers configured to operate within substantially the same range of frequencies, and;
- a capacitor operably secured to one driver of said pair of drivers so as to gradually mute said one driver as a predefined frequency is approached and a capacitance of the capacitor to gradually mute said one driver at the predefined frequency is a function of the defined distance.

2. The speaker of claim 1, wherein said capacitor also serves to gradually increase the power provided to the other driver as said predefined frequency is approached.

3. The speaker of claim 2, wherein said one driver has an electrical resistance, and said capacitor has a defined capacitance connected across said one driver so that the defined capacitance of said capacitor and said resistance of said one driver define a low pass filter.

4. The speaker of claim 1, wherein said pair of drivers are substantially identical to each other.

5. The speaker of claim 4, wherein said speaker is a computer speaker, and said defined distance is greater than about 0.5 inches.

6. The speaker of claim 5, wherein said defined distance is about 2.5 inches.

7. The speaker of claim 1, wherein said predefined frequency is above about 5600 Hertz.

8. The speaker of claim 7, wherein said predefined frequency is about 5600 Hertz.

9. The speaker of claim 1, wherein said frequency dependent shunting network is a low pass filter operably secured to said one driver.

10. The speaker of claim 1, wherein said speaker includes no other drivers except said pair of drivers.

11. A speaker operably secured to a network for applying an appropriate frequency component of an electrical input drive signal, said speaker comprising:
- a frame;
- a pair of drivers operably secured to said frame and spaced apart from each other by a defined distance;
- said pair of drivers configured to operate within substantially the same range of frequencies, and connected to the network;
- a capacitor operably secured to one driver of said pair of drivers so as to gradually mute said one driver as a predefined frequency is approached by the network and a capacitance of the capacitor to gradually mute said one driver at the predefined frequency is a function of the defined distance.

12. The speaker of claim 11, wherein said capacitor fully mutes said one driver above a second predefined frequency, and said second predefined frequency is higher than said predefined frequency.

13. The speaker of claim 11, wherein said pair of drivers are connected in series to the network.

14. The speaker of claim 11, wherein said speaker is a computer speaker and said predefined frequency is above about 5600 Hertz.

15. The speaker of claim 11, wherein said pair of speakers are mounted in substantially the same plane.

* * * * *